United States Patent [19]

Cricchi et al.

[11] 4,233,673
[45] Nov. 11, 1980

[54] ELECTRICALLY RESETTABLE NON-VOLATILE MEMORY FOR A FUSE SYSTEM

[75] Inventors: James R. Cricchi; Gustav Cavar, both of Baltimore, Md.

[73] Assignee: Westinghouse Electric Corp., Pittsburgh, Pa.

[21] Appl. No.: 49,429

[22] Filed: Jun. 24, 1970

[51] Int. Cl.³ .............................................. G11C 11/40
[52] U.S. Cl. .................................... 365/184; 365/189; 102/276
[58] Field of Search ...................... 340/173 R, 173 FF; 365/184

[56] References Cited

U.S. PATENT DOCUMENTS

| | | | |
|---|---|---|---|
| 3,508,211 | 4/1970 | Wegener | 340/173 R |
| 3,549,911 | 12/1970 | Scott | 340/173 R |
| 3,571,809 | 3/1971 | Nelson | 340/173 R |
| 3,680,062 | 7/1972 | Cricchi | 365/184 |
| 3,733,591 | 5/1973 | Cricchi | 365/184 |

*Primary Examiner*—Nelson Moskowitz

[57] ABSTRACT

A non-volatile memory has a plurality of storage bits, each bit comprising an insulated gate field effect transistor having a variable threshold voltage and selectively set to first and second stable threshold voltages in response to the application of positive and negative polarizing voltages between the gate and source thereof. The threshold voltage state of the transistor is determined by applying a read voltage having a magnitude greater than the first stable threshold voltage and less than the second stable threshold voltage, the transistor being activated only if it has assumed the first threshold voltage. Complementary addressing circuitry selectively and sequentially couples the data bits of a serial data word, received at a data terminal, to corresponding memory bits for storage in the memory. The memory bits are initially cleared by applying a positive polarizing voltage to the transistors to set them to the first stable threshold state. The addressing circuitry selectively applies a negative polarizing voltage to the transistors to set them to the second stable threshold state in accordance with the data word. The addressing circuitry also provides for interrogation of the memory by applying a read voltage to the bits in sequence and coupling the bits to the data terminal. A fire command generated by the firing of a projectile, such as an artillery shell, transfers the information in the memory to a counter. The counter is then operated at a predetermined clock rate until overflow occurs for generating a signal for detonating the explosive projectile.

10 Claims, 5 Drawing Figures

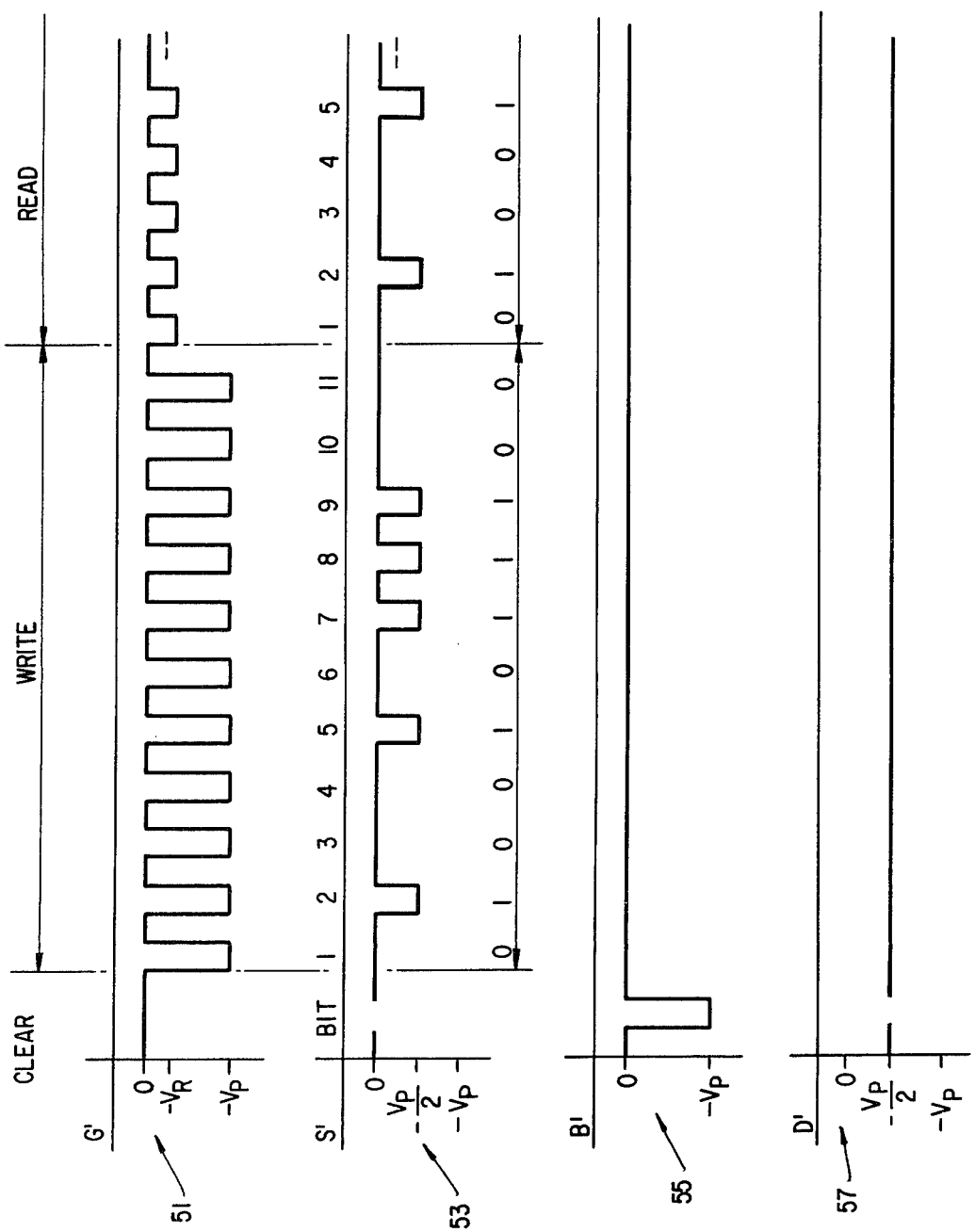

ELECTRICALLY RESETTABLE NON-VOLATILE MEMORY FOR A FUSE SYSTEM

BACKGROUND OF THE INVENTION

1. Field of the Invention

This invention relates to a memory for use in a fuse system and, more particularly, to an electrically resettable, non-volatile memory utilizing variable threshold, field effect transistors as memory bits.

2. Description of the Prior Art

Prior art memories for fuse systems frequently employ magnetic cores as the memory bit storage elements. A magnetic core memory is non-volatile, in that it can retain stored information in the form of a flux field without standby power, and also is electrically resettable. Further, the flux state of the memory core may be read a limited number of times to determine the information stored in the memory. However, memory cores have the disadvantages of being large in size and requiring relatively high power driving circuitry.

A memory system utilizing voltage variable threshold field effect transistors is described in application Ser. No. 46,381 filed June 15, 1970 by J. R. Cricchi and assigned to the assignee of the present invention. In that memory system, a serial data word is advanced into a shift register and stored therein in voltage levels corresponding to positive and negative polarizing voltages. A system of write transmission gates communicates between the stages of the shift register and corresponding storage bits of the memory, and the gates are energized to transfer the information in the shift register to the storage bits of the memory. Further, a system of read transmission gates is provided for transferring the information stored in the memory to the shift register for reading purposes. The system of transmission gates and the buffer shift register limit the time period during which the large magnitude polarizing voltages, used to write information in the storage transistors, are applied to the semiconductor junctions in the system.

It is desirable to achieve the function of the memory as disclosed in the noted application, but in a system wherein the number of semiconductor junctions subjected to the high voltage polarizing voltage is reduced, thereby reducing the power handling capability of the circuits, and permitting a reduction of the number of buffer and gate elements required in that memory. The present invention is an improvement over that previously disclosed invention, substantially reducing the number of junctions subjected to the high polarizing voltages, and affording various other advantages.

SUMMARY OF THE INVENTION

In the present invention, a memory for a fuse system is provided having a plurality of storage bits each comprising a variable threshold voltage field effect transistor. The transistors are selectively set to first and second stable threshold voltage states in response to positive and negative polarizing voltages. The threshold state of each transistor is determined by applying a read voltage of greater magnitude than the first threshold voltage, and of less magnitude than the second threshold voltage to the gate electrode; when in the first state, the transistor is activated by the read voltage to produce an output, but when in the second state, remains inactivated.

A complementary addressing means having a data terminal is utilized for sequentially and selectively accessing the storage bits in the memory. Initially, the storage bits are cleared by applying a positive polarizing voltage to the gate electrode of the transistors while maintaining the source electrode at zero volts to set the transistors to the first stable voltage threshold state. During the write operation, and in response to a serial data word received at the data terminal, the addressing means sequentially couples the plural bits of the data word to respectively corresponding storage bits, selectively coupling a negative polarizing voltage generated by the write means to the gate electrode of the sequentially addressed transistors in accordance with the data bits for storing the data word. During a read operation, a read voltage is applied to the gate electrodes of the memory bit transistors, and the addressing means sequentially couples the storage bits to the data terminal. The fuse system also includes a main counter which is set to the data word stored in the memory in response to a fire command generated upon firing of an explosive projectile. The main counter then begins counting until a carry signal is generated, indicating that the explosive projectile is to be detonated.

The memory of the present invention and the fuse system incorporating that memory provide numerous advantages over prior art such systems and an improvement over the memory and fuse system of the invention of the above-noted copending application. The nonvolatile information storage capability of the memory and its capability of non-destructive read out, essentially any desired number of times, affords substantial advantages for such a memory when used in a fuse system or generally in any timing control system and, of course, has other areas of application. The elements of the memory may be formed by a single diffusion process into an epitaxial substrate, facilitating fabrication of the memory in integrated circuit form. The memory requires only a minimum of system inputs simplifying external connections to the memory for the read/write and control circuitry employed in operating the memory. In addition to a more simplified and efficient circuit design, the memory of the present invention essentially isolates the portions to which the large magnitude polarizing voltages are applied, restricting the application of those voltages to the transistor memory elements from the supply sources. Particularly, the other semiconductor junctions in the system such as those related to the logic and timing control circuitry are isolated from the large magnitude polarizing voltages. Thus, the remaining semiconductor junctions in the system are only subjected to the voltage levels of conventional logic voltages, simplifying the circuit design and construction.

BRIEF DESCRIPTION OF THE DRAWINGS

FIG. 5 is a timing diagram of the pulses applied to the input terminals of the memory of FIG. 1 during a typical operation.

DETAILED DESCRIPTION OF THE INVENTION

Figure 1:
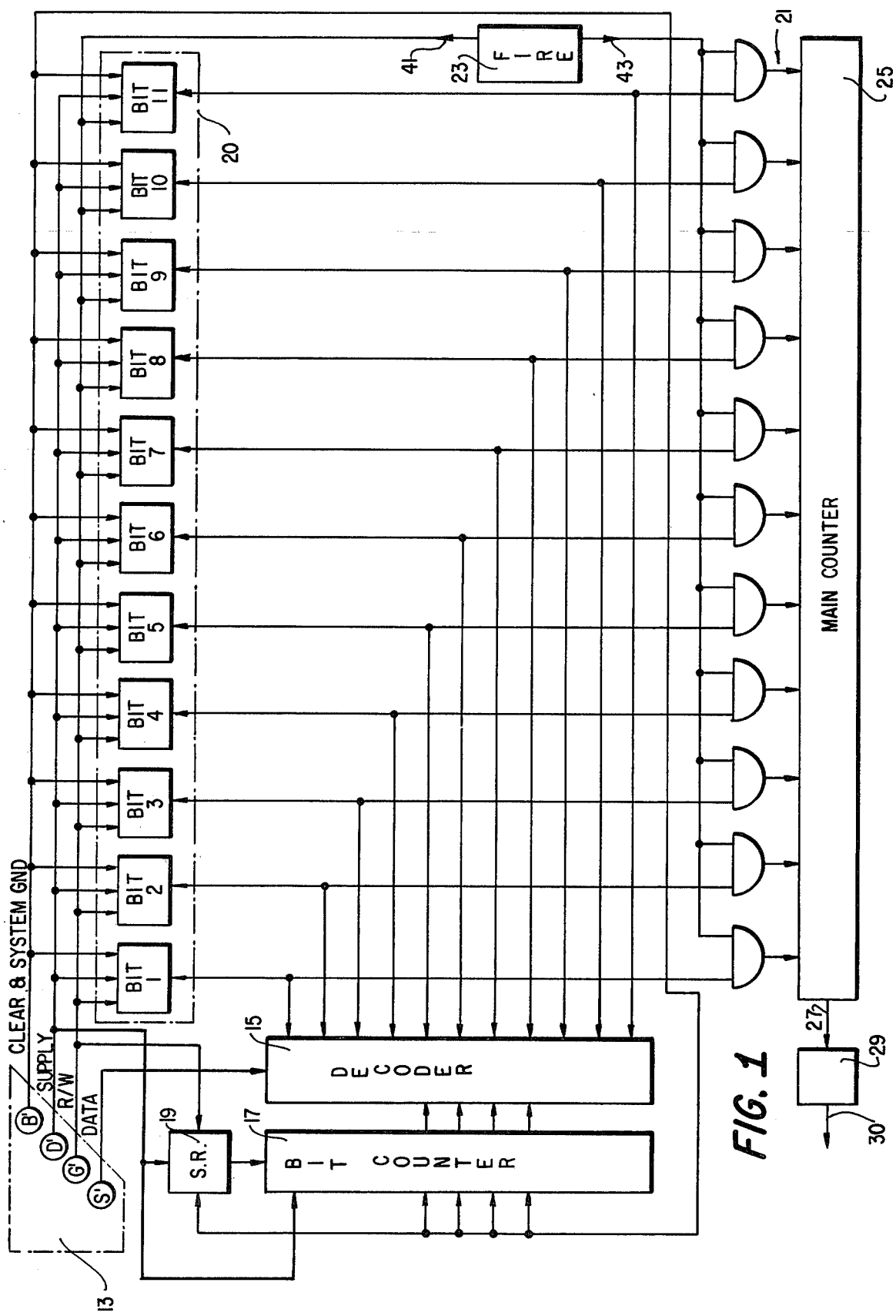
FIG. 1 is a block diagram of a fuse system incorporating a nonvolatile memory in accordance with the invention.

In FIG. 1 is shown a block diagram of a fuse system incorporating a memory 20. The memory 20 includes a plurality of storage bits, shown as bit 1 through bit 11, although any desired number of bits may be used in accordance with the desired memory capacity. The storage bits are selectively set to first and second stable threshold voltage states in response to the application of positive and negative polarizing voltages to the gate electrodes of the transistors. Thus, information is stored in the memory 20 in accordance with the pattern of stable voltage threshold states of the bits 1 to 11.

A terminal box 13 includes input control terminals B', D', G', and S', so labelled in part to correspond to similarly labelled terminals of elements of the memory as hereinafter explained. In general, the control signals and the data for controlling the reading and the writing of that data in the memory 20 are received at these input control terminals. Briefly, a serial data word to be stored in the memory is entered on data terminal S' and a control signal identifying and controlling the read/write function is applied to terminal G'. A supply voltage is applied to terminal D' which is connected in common to the drain electrodes of the storage bits of the memory 20 and to the supply voltage inputs of a shift register 19 and a bit counter 17. Terminal B' is connected in common to each of the bits of the memory 20 and to the bit counter 17 and shift register 19. A clear signal and a system ground signal are applied selectively to the terminal B' to clear the bits of the memory 20 and reset the counter 17 and shift register 19 prior to any subsequent write operation, and for maintaining a system ground operating potential for performing read/write functions, respectively, as explained more fully hereinafter. The decoder 15, bit counter 17, and shift register 19 function as addressing circuitry for selectively and sequentially addressing individual bits of the memory 20 to effect storage therein of corresponding data bits of the serial data word received on the terminal S' for storage in the memory 20 and also for selectively and sequentially addressing or accessing the plural bits of the memory 20 during a read operation to determine the data word stored therein.

The read/write signal applied to terminal G' is received by the shift register 19 which produces a one stage delay to that signal and supplies the thus delayed read/write signal produced at its output to the bit counter 17 for indexing the counter. As later detailed, the read/write signal directly supplies the polarizing voltage to the bits of the memory 20. Therefore, the read/write signal preferably is AC coupled to the shift register 19 to avoid application to the semiconductor junctions of the shift register, of the DC value of the large magnitude polarizing voltage of the read/write signal.

The bit counter 17 is thus indexed in accordance with the read/write signal and performs a counting operation in accordance with the successive bits of the serial data word as received, and which define the basis of the sequential addressing of the plural bits of the memory 20 for storage of the corresponding data bits of the serial data word. More specifically, the decoder 15 responds to the control output of bit counter 17, representing the advancing bit counter accumulation, for selectively and sequentially coupling the data terminal S' connected at its input to the input of the respectively corresponding bit storage elements of the memory 20.

The addressing circuitry is complementary in that during the read operation the decoder 15 responds to the bit counter 17 to selectively and sequentially connect each of the bits of the memory 20 to the data terminal S' for reading out the serial data word stored therein.

In use of the memory 20 of the invention in a timing control, or fuse system, the serial word stored in the memory defines a time duration which is to elapse following a first event which may occur at a random time, such as the firing of a projectile, at the expiration of which a further event, such as detonation of an explosive carried by the projectile, is to be effected. In accordance with such a function, each of the storage bits of the memory 20 is individually coupled to a first input of a corresponding one of a plurality of AND gates 21, the outputs of which are coupled to corresponding stages of a main counter 25. A fire logic circuit 23 which itself may generate the fire command for the projectile or which responds to detection of the firing of the projectile generates, at a first output 43 connected in common to the second input of each of the AND gates 21, a signal such as a fire command identifying the occurrence of that first event. The AND gates 21 are enabled by the output of the fire logic circuit 23 for coupling the information stored in memory 20 to the main counter 25. The fire logic circuit 23 also supplies a read signal on output 41 connected in common to the storage bits of memory 20 simultaneously with the application of the supply voltage to drain terminal D' to effect the read out of the information from the storage bits. Thus, the fire logic 23 provides both for reading out the memory 20 and enabling the AND gates 21 to set the counter 25 to the data word stored in the memory.

The main counter 25 then proceeds to count until overflow occurs at which time it generates a carry signal on its output 27 for setting a carry flip-flop 29. The setting of the carry flip-flop 29 produces a detonate command on output lead 30 to trigger detonation of the explosive projectile. Thus, the data word stored in memory serves to define the time duration between the event corresponding to the fire command and the subsequent event corresponding to the detonate command which is to be produced a precise time interval following the first event.

Figure 2:
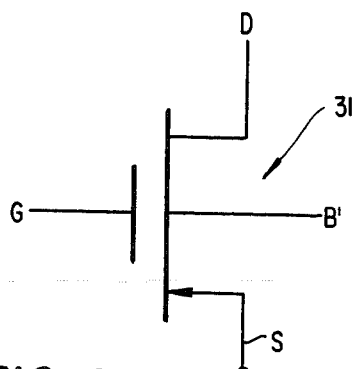
FIG. 2 is a schematic diagram of an insulated gate field effect transistor used as a memory element in the invention.
Figure 3:
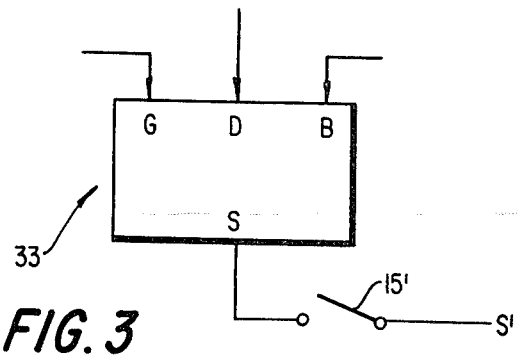
FIG. 3 is a block diagram of the transistor of FIG. 2.
Figure 4:
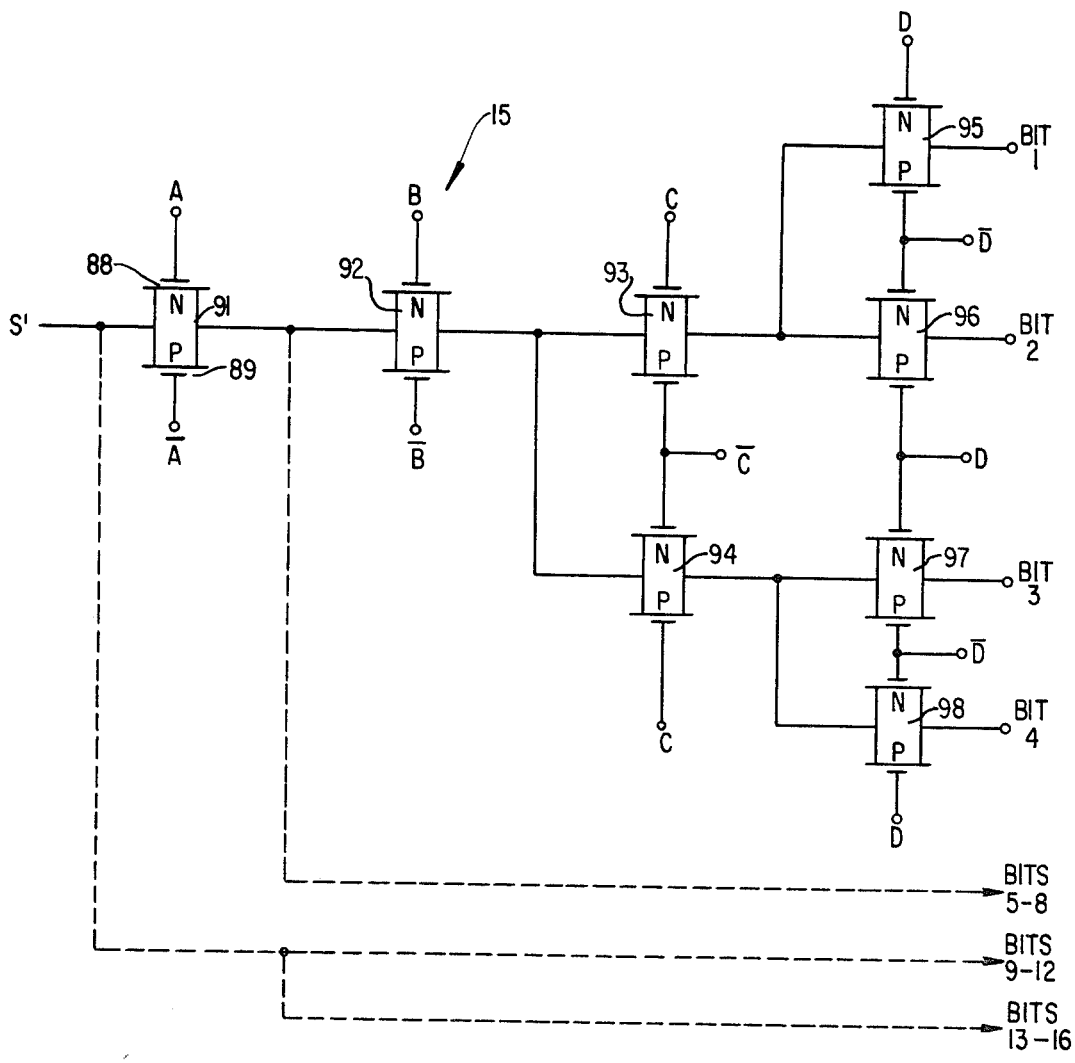
FIG. 4 is a schematic diagram of a portion of a complementary decoder used in the memory of FIG. 1.

Before proceeding with a detailed description of the operation of the system of FIG. 1, reference is had to FIGS. 2 and 3 which show in schematic and block diagram form, respectively, a P-channel field effect transistor of the type used as a storage bit in the memory 20 and to FIG. 4, which shows a portion of the complementary decoder 15. As noted, the storage element transistors employed in the invention have a threshold voltage variable between two stable states in response to corresponding polarizing voltages; such transistors may comprise metal insulated semiconductor (MIS) transistors of the type disclosed in detail in application Ser. No. 49,398 filed June 24, 1970 now U.S. Pat. No. 3,733,591 by J. R. Cricchi and W. W. Beydler and assigned to the assignee of the present invention.

In the schematic of FIG. 2, the transistor 31 includes a gate electrode G, a source electrode S, a drain electrode D, and a body electrode B. The threshold voltage of the transistor 31 is varied by applying a polarizing voltage between the gate G and source S in accordance with the gate to source mode of operation. Alternatively, the transistor may be operated in the gate to body mode wherein the polarizing voltage is applied between the gate G and the body B.

To switch the transistor 31 to a first stable threshold voltage state, a polarizing voltage is applied between the gate electrode G and the source electrode S of a value of $+V_P$. In the preferred embodiment of the invention, this is accomplished by applying a polarizing voltage $-V_P$ to the source electrode S which effectively renders the gate electrode G positive by the amount of $V_P$ with respect to the source; this operation is, of course, equivalent to applying a positive polarizing voltage $+V_P$ to the gate electrode G. To set the transistor 31 to the second stable threshold voltage state, a negative polarizing voltage $-V_P$ is applied to the gate electrode G rendering the gate electrode G negative with respect to the source S. Typically, the polarizing voltage is approximately 45 volts in either the positive or negative polarity as indicated, and the resultant two stable threshold voltages are approximately $-2$ volts and $-15$ volts, respectively. Thus, the transistor 31 may be selectively set to store information in the form of two different stable threshold voltage states. The transistor retains either of the stable states thus assumed without the further application of standby power due to a charge storage effect.

Application of a voltage to the gate electrode G which is substantially less than the polarizing voltage $V_P$, for example $V_P/2$, produces no change in the stable threshold state of the transistor. Thus, the transistor threshold state may be determined by application of a read voltage to the gate electrode of value intermediate the two threshold values and in any event less than the polarizing voltage but greater than the first threshold voltage level.

The transistor 31 of FIG. 2 is shown in block diagram form in FIG. 3, the block diagram element 33 corresponding to any of the bits 1 through 11 of the memory 20 in FIG. 1. The terminals labelled G, D, B, and S in FIG. 3 correspond to the similarly labelled terminals in FIG. 2. Further, with respect to FIG. 1, the connections to the blocks representing bits 1 through 11 correspond to those as shown in FIG. 3 and thus the gate, drain, and body terminals or electrodes G, D, and B as shown in FIG. 3 are connected to the read/write terminal G', the supply terminal D', and the clear and system ground terminal B' of the terminal unit 13 of FIG. 1. Further, the source electrode in the block diagram of FIG. 3 is shown connected to a switch 15' in turn connected to terminal S' corresponding to the data terminal S' in the terminal unit 13 of FIG. 1.

Considering more fully the operation of the transistor as a memory element in the context of the invention, and with reference to FIGS. 1 through 3, the transistor bit storage elements are initially cleared, in common, to the first threshold state. This is accomplished by a clear signal at terminal B' which comprises a polarizing voltage $-V_P$ and which is thereby applied, as to each transistor, to the body electrode B rendering the gate electrode G positive with respect to the body electrode B by an amount $V_P$. The clear operation is performed preparatory to every write operation. In the write operation, a negative polarizing voltage $-V_P$ is applied to the gate electrode G and the data signal, having a voltage level of either zero volts or $-V_P/2$ in accordance with the convention adopted from the "1" and "0" data bits, is coupled to the source electrode S through the decoder path switch 15'. During the write operation, the body electrode B is maintained at ground potential in accordance with the supply of the system ground signal to terminal B' as above noted.

When a data bit signal of zero volts is applied to a source electrode S, the resultant potential between the gate and source electrodes G and S is sufficient to set the transistor to the second stable threshold voltage state. However, when a data bit signal of $-V_P/2$ volts is applied to the sources, the resultant potential between the gate and source electrodes G and S is $-V_P/2$ which is substantially less than the polarizing voltage. The transistor therefore retains the first threshold voltage state assumed in the clear operation. Thus, the data signal either causes the transistor to retain the first stable threshold state or to be set to the second stable threshold state.

To determine, or read, the threshold voltage state assumed by the transistor 31, a read voltage $-V_R$ is applied to the gate electrode G and a negative drain voltage $-V_D$ is applied to the drain electrode D. Preferably, the drain voltage $-V_D$ is equal to $-V_P/2$. The body electrode B is connected to ground during the read operation as well as during the write operation. The read voltage $-V_R$ is greater in magnitude than the first threshold voltage and less than the second threshold voltage. Thus, if the transistor has assumed the first threshold voltage, the transistor is turned on and an output voltage equal to the drain voltage $-V_D$ less the threshold voltage is produced at the source electrode S. However, if the transistor has assumed the second threshold voltage, the read voltage $-V_R$ applied at the gate electrode G is insufficient to turn the transistor on and the output voltage at source electrode S remains at ground potential. Since the magnitude of read voltage $-V_R$ is substantially less than the polarizing voltage $V_P$, application of the read voltage does not disturb the threshold voltage state of the transistor, thus affording a non-destructive read out capability.

FIG. 4 is a block diagram of a portion of the complementary decoder 15 of FIG. 1. As indicated in FIG. 1, decoder 15 is coupled to bit counter 17, the latter having four stages and thus having capacity to decode any number of bits up to sixteen. Each counter stage has normal and complementary outputs designated, for example, A and $\overline{A}$, respectively. The complementary outputs of each of the four stages are applied to the decoder 15 as indicated in FIG. 4.

More specifically, the complementary decoder 15 comprises a plurality of bidirectional gates 91 to 98. Each gate comprises an N-channel field effect transistor and a P-channel field effect transistor coupled in parallel. For example, gate 91 comprises an N-channel transistor 88 and a P-channel transistor 89. A logic voltage $+V$ applied to the control electrode of the N-channel transistor 88 turns the transistor 88 on, while a logic voltage $-V$ applied to the control gate of the transistor 89 turns the transistor 89 on. Each of the transistors 88 and 89 has a threshold voltage drop in the "on" condition which is equal in magnitude and opposite in polarity to that of the other. Therefore, if the transistors are simultaneously energized in the parallel configuration no voltage drop occurs across gate 91. In the opposite condition, of course, both of the transistors 88 and 89 are off. As a result, the gate 91 operates in a manner analogous to a simple switch which, when closed, presents substantially no voltage drop across its terminals and, when open, presents an open circuit.

When stage A of the counter is reset, $\overline{A} = -V$ and $A = +V$. Therefore, $-V$ volts appears at the control gate of the P-channel transistor 89 and $+V$ volts appears at the control gate of the N-channel transistor 88 with the result that gate 91 is on. When stage A of the counter is set, $\overline{A} = +V$ and $A = -V$. Therefore, $+V$ volts appears at the control gate of the P-channel transistor 89 and $-V$ volts appears at the control gate of the N-channel transistor 88 with the result that gate 91 is off. Stage B of the counter operates in the same manner, with gate 92 turning on when stage B is reset and turning off when stage B is set.

When stage C of the counter is reset, $\overline{C} = -V$ and $C = +V$. Therefore, gate 93 is on and gate 94 is off when stage C is reset.

When stage C of the counter is set, $\overline{C} = +V$ and $C = -V$ with the result that gate 93 is off and gate 94 is on.

When stage D of the counter is reset, $\overline{D} = -V$ and $D = +V$ with the result that gates 95 and 97 are on and gates 96 and 98 are off. Conversely, when stage D of the counter is set, $\overline{D} = +V$ and $D = -V$ with the result that gates 95 and 97 are off and gates 96 and 98 are on.

Initially, the bit counter 17 is set to binary condition 0000 and stages A, B, C, and D are reset. In the decoder 15, a path is formed from data terminal S' to bit 1 through gates 91, 92, 93, and 95. Since gates 94 and 96 are off, the path from data terminal S' to bit 1 is the exclusive path for the decoder. Thus, the voltage appearing at the data terminal S', representing a data bit, is coupled to bit 1 at its source electrode.

Next, the counter is indexed to binary condition 0001 and stage D is reset. Stages A, B, and C remain in the same condition. In this binary condition, gate 95 is off and gate 96 is on with the gates having inputs from counter stages A, B, and C remaining unchanged. Thus, an exclusive path is formed from data terminal S' to bit 2.

The counter next indexes to binary condition 0010. The D stage is set with gate 97 being on and gate 98 being off while stage C is reset with gate 94 being on and gate 93 being off. The gates having inputs from stages A and B of the counter remain unchanged. Thus, an exclusive path is formed from data terminal S' to bit 3.

The counter then indexes to binary condition 0011 with stage D being reset, gate 98 being on, and gate 97 being off. The gates having inputs from stages A, B, and C remain the same as for the previous condition. Thus, an exclusive path is formed from data terminal S' to bit 4.

The decoder logic (not shown) for bits 5 through 16 operates in a similar fashion. When stage A is reset and stage B is set during binary conditions 0100 to 0111 an exclusive path to bits 5 through 8 is formed depending on the state of stages C and D of the counter. When stage A is set and stage B is reset during binary conditions 1000 to 1011 an exclusive path is formed to bits 9 through 12 depending on the state of stages C and D. When stage A and stage B are set during binary conditions 1100 to 1111 an exclusive path is formed to bits 13 through 16 depending on the state of stages C and D. However, since in the preferred embodiment only eleven bits are provided in the memory, decoder logic for bits 13 through 16 may be eliminated if desired. The provision of decoder logic for bits 13 through 16 allows extension of the memory to any number of bits up to and including sixteen. Of course, the system may be expanded to handle any desired number of bits both in the memory 20 and in the decoder and addressing logic.

Since in the preferred embodiment, eleven storage bits are used in the memory, the bit counter 17 is reset to zero after the eleventh count. Thus, the bit counter is a scale of eleven counter. If sixteen storage bits are used in the memory no reset is required for the bit counter since the counter recycles to zero after a binary count of 1111. For a memory having any number of bits other than sixteen, the bit counter is a scale of N counter where N is the number of bits in the memory.

FIG. 5 shows a timing diagram of the pulses applied to the input terminals of the memory during a typical operation. The operation of the memory occurs in three steps. Initially, in the clear operation the memory is cleared to set storage bit 1 through bit 11 to the first threshold voltage state. Then in the write operation, a serial data word is written into the memory. After the information is stored in the memory, a read operation may be performed to provide a serial output of the data word stored in the memory.

In FIG. 5 the horizontal axis represents time while the pulse trains 51, 53, 55, and 57 represent the signals applied to input terminals G', S', B', and D', respectively, in accordance with the labelling of these terminals as also shown in FIG. 1. The clear, write, and read operations are indicated along the horizontal axis, with only a portion of the read operation being shown.

In the clear operation, zero volts is applied to terminal G', connected to the gate electrodes, and the polarizing voltage $-V_P$ is applied to terminal B', connected to the body electrodes. Terminals S' and D' are allowed to float to prevent application of the polarizing voltage $-V_P$ to the semiconductor junctions of the bit counter 17 and the shift register 19. As a result, the control electrodes of all the storage bits are held at zero volts while the body electrodes are held at $-V_P$ volts. Thus, the gate electrode of each bit is rendered positive with respect to the body electrode by a magnitude $V_P$ and all the storage bits are set to the first threshold voltage state. In addition, the polarizing voltage $-V_P$ on terminal B' is AC coupled to the bit counter 17 and shift register 19 to provide a reset signal but to isolate these units from the DC level of the polarizing voltage $-V_P$ when employed as a clear signal.

During the write operation and the read operation, terminal B' is maintained at zero volts while the voltage supply terminal D' is maintained at $-V_P/2$ volts. The voltage level $-V_P/2$ volts represents the logic level used in the system and is also supplied to bit counter 17 and shift register 19.

As previously mentioned, the data terminal S' is coupled to the decoder 15 which is in turn coupled to the source electrode of one of the storage bits depending on the condition of the bit counter 17. As the write operation begins, the bit counter is set to binary condition 0000 and the decoder 15 couples the data terminal S' to bit 1. As each write signal is received, the bit counter is indexed and the decoder 15 selectively and sequentially couples the data terminal S' to storage bit 1 through bit 11 as indicated in pulse train 53.

During the write operation, as each bit of the data word is received at terminal S', a write signal in the form of the polarizing voltage $-V_P$ is applied to terminal G'. If the resultant voltage between the gate electrode and the source electrode of the addressed storage bit renders the gate negative with respect to the source by an amount $V_P$, the addressed bit is set to the second threshold voltage. Thus, if zero volts appears at the data terminal, the storage bit is set to the second threshold voltage. However, if the voltage $-V_P/2$ appears at the source electrode of the addressed bit, the resultant voltage between the gate and the source is substantially less than the magnitude of the polarizing voltage $V_P$ and is insufficient to set the storage bit to the second threshold voltage.

A typical data word is illustrated in the pulse train 53 for the write operation. Binary designations have been assigned to the voltage levels in pulse train 53 with binary "0" representing zero volts and binary "1" representing $-V_P/2$ volts.

During the write operation each write signal on terminal G', shown in pulse train 51, steps the bit counter 17 and the data signal on terminal S', shows in pulse train 53, is sequentially coupled to storage bit 1 through bit 11. Therefore, the data word, shown in pulse train 53, is stored in the memory 11 with storage bits 1, 3, 4, 6, 10, and 11 being set to the second stable threshold voltage. The remaining bits 2, 5, 7, 8, and 9 retain the first stable threshold voltage set during the clear operation.

The read operation is performed by applying a read signal in the form of the read voltage $-V_R$ to terminal G'. Each read signal indexes the bit counter 17 and the decoder 15 sequentially couples bit 1 through bit 11 to the data terminal S'. The storage bits containing a binary "1" are set in the first threshold voltage state and are energized by the read signal while the storage bits containing a binary "0" are set in the second threshold voltage state and are not energized by the read signal. Thus, assuming that the first threshold voltage is negligible, the voltage $-V_P/2$ supplied to the drain electrode by terminal D' appears at the data terminal S' for the bits containing a binary "1". For the bits containing a binary "0," zero volts is coupled to the terminal S'. Since the read voltage $-V_R$ is insufficient to affect the threshold voltage of the storage bits, a non-destructive read out is obtained. Therefore, the value set in the data word may be read as many times as is desired.

The data word set in the memory is also read upon the firing of an explosive projectile. The firing of the projectile causes the fire logic 23 to supply a read voltage $-V_R$ on conductor 41 which is coupled to the gate inputs of the storage bits. The supply voltage appears on the terminal D' from the time the projectile is fired until it is detonated. Also a FIRE signal is generated on conductor 43 to enable the second input of AND gates 21 and transfer the data word in the memory 11 to the set inputs of main counter 25. A counting operation is then initiated in main counter 25. The counting continues until overflow occurs and a carry signal on output lead 27 is generated. The carry signal 27 sets carry flip-flop 29, generating an output such as a fire command on output lead 31 to detonate the explosive projectile.

It is apparent that various modifications may be made in the system described herein without departure from the scope of the invention. Accordingly, the invention is not to be considered limited by the description, but only by the scope of the appended claims.

We claim as our invention:

1. An electrically resettable memory for storing a plural bit data word comprising:
    a plurality of memory storage bits, each of said storage bits comprising a variable threshold voltage transistor having a first and a second stable state,
    means for applying a negative polarizing voltage to the gate of each of said storage transistors,
    memory clearing means for applying a positive polarizing voltage to said storage bits to set said storage bits to a first stable threshold voltage state,
    means for supplying a bi-level data signal representing a plural bit data word,
    addressing means for sequentially addressing said plurality of storage bits and for coupling the bi-level data signal to the source of said addressed storage bit transistors to enable storage of one of the bi-levels of the data signal such that a negative polarizing voltage is established between the gate and source thereby setting said addressed transistor to said second stable state, and to enable storage of the other of the bi-levels of the data signal such that a voltage substantially less than the polarizing voltage is established between the gate and source thereby retaining the first stable state of said addressed transistor set by said memory clearing means, and
    write means for selectively applying a negative polarizing voltage to an addressed storage bit to set said addressed storage bit to the second stable threshold voltage state in accordance with a predetermined, corresponding data bit.

2. An electrically resettable memory for storing a plural bit data word comprising:
    a plurality of memory storage bits, each of said storage bits comprising a transistor having a first and second variable threshold voltage,
    a main counter having a plurality of stages coupled to respectively associated storage bits of said memory,
    memory clearing means for applying a positive polarizing voltage to said storage bits to set said storage bits to a first stable threshold voltage state,
    means for applying a read voltage to the gates of the storage bit transistors, said read voltage being greater than said first stable threshold voltage and less than said second stable threshold voltage,
    addressing means for sequentially addressing said plurality of storage bits to enable storage of the plural data bits in corresponding storage bits,
    means for transferring the plural bit data word stored in said memory bits to the corresponding stages of the counter, and
    write means for selectively applying a negative polarizing voltage to an addressed storage bit to set said addressed storage bit to the second stable threshold voltage state in accordance with a predetermined, corresponding data bit.

3. The memory of claim 1 wherein the bi-level signal is received at a data terminal and wherein an input to said addressing means is connected to said data terminal and further includes:
    a bit counter having scale of N count where N is the number of storage bits in said memory, and
    complementary decoding means responsive to said bit counter for selectively coupling said data terminal to the sequentially addressed storage bits.

4. The memory of claim 3 wherein said bit counter means includes stepping means for stepping said bit counter in response to the reception of each bit of said plural bit data word.

5. The memory of claim 1 wherein said main counter further comprises means responsive to the transfer of a plural bit data word to said memory for initializing the count in said main counter and to effect stepping of said main counter until overflow occurs.

6. The memory of claim 1 wherein said transfer means includes:
   means for applying a read voltage to the gate of each of the storage bit transistors, said read voltage being greater than said first stable threshold voltage and less than said second stable threshold voltage, and
   a plurality of gates respectively associated with said plurality of corresponding memory storage bits and main counter stages, said plurality of gates being enabled in common by said read voltage produced by said transfer means.

7. An electrically resettable memory for a fuse system for storing a plural bit data word defining a predetermined time interval between a first random event and a second event, comprising:
   a plurality of memory storage bits, each of said storage bits comprising a variable threshold voltage transistor,
   memory clearing means for applying a positive polarizing voltage to the body, and a ground potential voltage to the gate of each of said storage bits in common to set said storage bits to a first stable threshold voltage state corresponding to a cleared condition of said memory,
   means for sequentially addressing said plurality of storage bits by selective connection to the sources of said storage bit transistors,
   write means for applying a negative polarizing voltage to the gate of each of said storage bit transistors in common and for supplying a bi-level, serial data signal representing the plural bit data word to the addressing means for selective coupling thereby to the sources of the sequentially addressed storage bits to establish, for one of the bi-levels of the data signal, a negative polarizing voltage between the gate and source of an addressed bit for setting to said second stable state, and to establish, for the other of the bi-levels of the data signal, a voltage substantially less than the polarizing voltage between the gate and source of an addressed bit for retaining the first stable state of the transistor set by said memory clearing means,
   a main counter having a plurality of stages coupled to respectively associated storage bits of said memory,
   means responsive to a first command defining the first read out event for transferring the plural bit data word stored in said memory bits to the corresponding stages of the counter for initializing the counter and to effect stepping of the counter until overflow occurs, and
   means responsive to overflow of the counter for generating a detonate command defining the second event.

8. The memory of claim 7 wherein the bi-level serial data signal is received at a data terminal and wherein said addressing means is connected at an input thereof to said data terminal and includes:
   a bit counter having scale of N count where N is the number of storage bits in said memory, and
   complementary decoding means responsive to said bit counter for selectively coupling said data terminal to the sequentially addressed storage bits.

9. The memory of claim 8 wherein said bit counter means includes stepping means for stepping said bit counter in response to the reception of each bit of said plural bit data word.

10. The memory of claim 7 further including:
    means for applying a read voltage to the gates of the storage bit transistors, said read voltage being greater than said first stable threshold voltage and less than said second stable threshold voltage, and
    said addressing means being complementary for sequentially addressing said storage bit transistors and selectively and sequentially coupling said sources thereof to said data terminal to effect read out of the plural bit data word stored in said memory.

* * * * *